(12) United States Patent
Shen et al.

(10) Patent No.: US 11,853,655 B1
(45) Date of Patent: Dec. 26, 2023

(54) METHOD OF PREDICTING A SHIP RESISTANCE BY DESIGNING AND IMPLEMENTING A MOMENTUM THICKNESS SIMILARITY SIMULATOR

(71) Applicant: United States of America As Represented by the Secretary of the Navy, Arlington, VA (US)

(72) Inventors: Young T. Shen, Potomac, MD (US); Michael J. Hughes, Vienna, VA (US); David E. Hess, Mt. Airy, MD (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 161 days.

(21) Appl. No.: 16/580,943

(22) Filed: Sep. 24, 2019

Related U.S. Application Data

(60) Provisional application No. 62/735,744, filed on Sep. 24, 2018.

(51) Int. Cl.
*G06F 30/15* (2020.01)
*B63B 3/14* (2006.01)
*G06F 17/13* (2006.01)
*G06F 30/20* (2020.01)

(52) U.S. Cl.
CPC .......... *G06F 30/15* (2020.01); *B63B 3/14* (2013.01); *G06F 17/13* (2013.01); *G06F 30/20* (2020.01)

(58) Field of Classification Search
CPC ............ G06F 20/15; G06F 17/13; B63B 3/14
USPC ............................................................ 703/8
See application file for complete search history.

(56) References Cited

U.S. PATENT DOCUMENTS

| 3,288,399 | A | 11/1966 | Gaster |
| 7,540,200 | B2 | 6/2009 | Yung et al. |
| 9,588,011 | B1* | 3/2017 | Shen ............ G01M 10/00 |

OTHER PUBLICATIONS

Iidstad_2018 (Use of Turbulence Stimulation on Ship Models, Norwegian University of Science and Technology, Department of Marine Technology, Jun. 2018) (Year: 2018).*
Puttkammer_2013 (Boundary Layer over a Flat Plate, University of Twente, Engineering Fluid Dynamices Jun. 2013) (Year: 2013).*
Lindstad_2018 (Use of Turbulence Stimulation on Ship Models, NTNU Jun. 2018) (Year: 2018).*
Huang_1980 (Boundary-layer Flow on an Axisymmetric Body with an Inflected Stern, Aug. 1980). (Year: 1980).*

(Continued)

*Primary Examiner* — Brian S Cook
(74) *Attorney, Agent, or Firm* — Dave A. Ghatt; Howard Kaiser

(57) ABSTRACT

A full-scale resistance prediction for ships. More particularly, the invention is directed to full-scale resistance predictions for ships using model scale resistance tests. This process involves the designing of a momentum thickness similarity simulator for a model, to accurately determine a model resistance and ultimately to predict a ship resistance. The simulator modifies the geometry of the model, and its design is optimized to accurately predict the ship resistance. The simulator may be an external device such as a wire ring (trip wire), sand paper, or a Hama strip, or the simulator may be integrally formed on the body of the model.

4 Claims, 11 Drawing Sheets

(56) References Cited

OTHER PUBLICATIONS

U.S. Appl. No. 62/735,744, filed Sep. 24, 2018, Navy case No. 106,410, entitled "Method for Scaling Sub Surface Vesel Resistance Model Data," listed inventors Young T. Shen, Michael J. Hughes, and David E. Hess.
Young T. Shen and Michael J. Hughes, "A New Method for Scaling Submarine Resistance Model Data," 19 pages, SNAME 30th American Towing Tank Conference, Naval Surface Warfare Center, Carderock Division, West Bethesda, Maryland, Oct. 3-5, 2017.
Benjamin McKnight III, "A Look Back: The Legacy of Carderock's Dr. Young Shen," Naval Surface Warfare Center, Carderock Division, Public Affairs, published Feb. 28, 2020, article available on www.navsea.navy.mil website.
Young T. Shen and Michael J. Hughes, "Ship Hull Resistance Prediction from Model Tests with a Resistance Similitude Simulator," Abstract available at https://onepetro.org/JSR/article-abstract/65/02/87/450664/Ship-Hull-Resistance-Prediction-from-Model-Tests, published online Jun. 30, 2021 (This abstract is of an article contained in Journal of Ship Research, vol. 65, issue 02, Jun. 2021).
Jun Seok and Jong-Chun Park, "Numerical Simulation of Resistance Performance According to Surface Roughness in Container Ships," International Journal of Naval Architecture and Ocean Engineering 12 (2020), pp. 11-19, available online Jun. 13, 2019.
P. Jagadeesh and K. Murali, "Investigations on Alternative Turbulence Closure Models for Axisymmetric Underwater Hullforms," The Journal of Ocean Technology, vol. 1, No. 2, pp. 37-57 (2006).
Jason Christopher Murphy, "A Novel Approach to Turbulence Stimulation for Ship-Model Testing," Trident Scholar Report No. 390 (2010), U.S. Naval Academy, Annapolis, Maryland, 88 pages (Nov. 5, 2010).
L. Krishnan and N.D. Sandham, "Effect of Mach Number on the Structure of Turbulent Spots," Journal of Fluid Mechanics, vol. 566, pp. 225-234, Cambridge University Press (2006).
Jerome S. Parsons and Raymond E. Goodson, "Shaping of Axisymmetric Bodies for Minimum Drag in Incompressible Flow," Journal of Hydronautics, vol. 8, No. 3, pp. 100-107 (Jul. 1974).
Y. Shen, M. Hughes, and J. Gorski, "Resistance Prediction on Submerged Axisymmetric Bodies Fitted with Turbulent Spot Inducers," Journal of Ship Research, Society of Naval Architects and Marine Engineers (SNAME), vol. 59, No. 2, Jun. 2015, pp. 1-14 (appeared or available online: Apr. 22, 2015).
Fast Track Articles for Journal of Ship Research, Ingentaconnect website, http://www.ingentaconnect.com/content/sname/jsr/pre-prints;jsessionid=5qg20sst4gqps.victoria (3 pages; accessed on May 6, 2015).
Y. Shen, M. Hughes, and J. Gorski, "Resistance Prediction on Submerged Axisymmetric Bodies Fitted with Turbulent Spot Inducers," Journal of Ship Research, Society of Naval Architects and Marine Engineers (SNAME), vol. 59, No. 2, Jun. 2015, Abstract, Ingentaconnect website, http://www.ingentaconnect.com/content/sname/jsr/pre-prints/content-JOSR140041;jsessionid=2k2f3n1r666qi.victoria (2 pages; accessed on May 6, 2015).
Journal of Ship Research publication web page, Ingentaconnect website, http://www.ingentaconnect.com/content/sname/jsr (4 pages; accessed on May 6, 2015).

* cited by examiner

Pressure distribution, boundary layer velocity profile, and boundary layer thickness distributions on ONR Body1

Mapping of flow on ONR Body 1 to flow on an equivalent flat plate

Momentum thickness distribution on ship at 20 knots ($Re_S=1.5 \times 10^9$)

Momentum thickness distribution on model tested without a simulator at 6 knots ($Re_M = 2.3 \times 10^7$)

Momentum thickness distribution on model tested in a hypothetical fluid for Test CASE1 ($Re_M = 1.5 \times 10^9$)

Flat plate resistance Point A at Re = $10^7$, Points B and C at Re = $5 \times 10^5$ (Van Manen, 1988)

Momentum thickness distribution on model with upstream disturbance for Test CASE2 ($Re_M$ =$2.3 \times 10^7$)

Momentum thickness distribution on model for Test CASE1 ($Re_M$ = 1.5x10$^9$) and Test CASE2 ($Re_M$ =2.3x10$^7$)

Target of momentum thickness distribution on model to be simulated in towing tank test at 6 knots ($Re_M$ =2.3x10$^7$)

Momentum thickness simulator location $S_k$ and height k

Simulated momentum thickness with the simulator for Test CASE3 (Re$_M$ =2.3x10$^7$)

Parasitic drag coefficients of Hama strips and trip wires

Reynolds number based on Hama strip thickness to produce delta drag based on velocity at edge of Hama strip on ONR Body 1 with length of 7 meters at test speed of 6 knots Hama strip thickness to match delta drag on ONR Body 1, L=7 meters, at test speed of 6 knots

METHOD OF PREDICTING A SHIP RESISTANCE BY DESIGNING AND IMPLEMENTING A MOMENTUM THICKNESS SIMILARITY SIMULATOR

CROSS-REFERENCE TO RELATED APPLICATIONS

This application claims the benefit of U.S. Provisional Application No. 62/735,744 filed Sep. 24, 2018, which is incorporated herein by reference.

STATEMENT OF GOVERNMENT INTEREST

The following description was made in the performance of official duties by employees of the Department of the Navy, and, thus the claimed invention may be manufactured, used, licensed by or for the United States Government for governmental purposes without the payment of any royalties thereon.

TECHNICAL FIELD

The following description relates generally to full-scale resistance predictions for ships. More particularly, the invention is directed to full-scale resistance predictions for ships using model scale resistance tests.

The following is a list of symbols and notations used throughout the Written Description and the Drawings:

c cord length
$c_{fl}$ coefficient for local shear stress in laminar boundary layer
$c_{fl'}$ modified local shear stress coefficient for laminar boundary flow on a flat plate with logarithmic singularity removed
$c_{ft}$ coefficient for local shear stress in turbulent boundary layer
$c_{ft'}$ modified local shear stress coefficient for turbulent boundary flow on a flat plate with logarithmic singularity removed
$C_D$ airfoil profile drag coefficient
$C_{Dtrip}$ drag coefficient for parasitic drag from trip wire or Hama strip
$C_f$ flat plate frictional resistance coefficient
$C_{fM}$ flat plate frictional resistance coefficient for a model
$C_{fS}$ flat plate frictional resistance coefficient for a full-sized ship
$C_F$ body frictional resistance coefficient
$C_P$ pressure coefficient
$C_R$ residual resistance coefficient
$C_{RM}$, residual resistance coefficient for a model
$C_{RS}$ residual resistance coefficient for a full-sized ship
$C_T$, total ship hull resistance coefficient
$C_{TM}$ total ship hull resistance coefficient for a model
$C_{TS}$ total ship hull resistance coefficient for a full-sized ship
D drag
$D_{trip}$ parasitic dragon trip wire or Hama strip
G universal scaling coefficient
k height/thickness of trip wire or Hama strip
K form factor relating body total drag to flat plate frictional drag
$K_M$ form factor relating body total drag to flat plate frictional drag for a model
$K_S$ form factor relating body total drag to flat plate frictional drag for a full-sized ship
L length of ship hull
$L_M$ length of model hull
$L_S$ length of full-sized ship hull
LE body nose/airfoil leading edge
$n_1$ form factor relating body frictional drag to flat plate frictional drag
$n_2$ form factor relating body residual drag to body frictional drag
r local body radius
R total resistance
$R_M$ total resistance for a model
$R_S$ total resistance for a full-sized ship
Re Reynolds number based on ship speed and hull length
$Re_M$ Reynolds number based on model speed and model hull length
$Re_S$ Reynolds number based on full-sized ship speed and ship hull length
$Re_x$ Reynold number based on local velocity and distance from LE
$Re_k$ Reynold number based on local velocity and trip height
s(x) local are length from LE to x
$s_k$ arc length from LE to location of trip wire or Hama strip
S total are length along the hull
$S_A$ ship hull surface area
$S_{AM}$ model hull surface area
$S_{AS}$ full-sized ship hull surface area
TE body tail/airfoil trailing edge
u local tangential velocity
$u_k$ tangential velocity in the boundary layer at trip location at height k
U local tangential velocity at the edge of the boundary layer
$U_M$ local tangential velocity at the edge of the boundary layer for the model
$U_S$ local tangential velocity at the edge of the boundary layer for full-sized ship
$U_I$ local tangential velocity at the edge of the boundary layer at body tail
V body velocity
$V_M$ model body velocity
$V_s$ full-sized ship body velocity
$V_M$ model body velocity
x local axial position along body
$x_k$ axial location of trip wire or Hama strip
$x_T$ axial location of transition
y distance from body surface along line normal to the body surface
α angle between vector tangent to body and body centerline
δ boundary layer thickness
λ scale ratio
υ kinematic viscosity
ρ density
θ momentum thickness of boundary layer
$θ_1$ momentum thickness of boundary layer at TE
$ψ_0$ momentum area of wake far downstream from body
$ψ_1$ momentum area at TE of body Note: for all the symbols, a subscript "M" represents a model-scale value and a subscript "S" represents a full-scale value.

BACKGROUND

Traditionally, model-scale submarine resistance data is scaled using Froude's Hypothesis, where the resistance is decomposed into frictional resistance and residual resistance. Ship resistance is critical to ship owners and ship designers to estimate fuel consumption, fuel cost, power plant size selection and propulsor design. Due to the complex flow around the ship hull and extensive full-scale trial data, ship resistance prediction still relies on model tests. Let $R_S$ denote the ship hull resistance and $C_{TS}$ the ship hull resistance coefficient, which are related by:

$$R_S = C_{TS}(1/2)\rho_S V_S^2 S_{AS}, \tag{1}$$

In equation (1) the subscript "S" denotes physical parameters associated with the full-scale ship, and the subscript "M" will denote a model-scale value. These subscripts "S" and "M" are used throughout this entire Written Description to represent the full-scale ship and the model-scale as used in Equation (1).

A ship's hull surface area $S_{AS}$ can be calculated from the ship's hull geometry. If the ship hull resistance coefficient $C_{TS}$ can be estimated, then the ship resistance $R_S$ at ship speed $V_S$ can be calculated from Equation (1). As stated above, existing prediction methods still follow Froude's 1868 hypothesis that the ship resistance coefficient $C_{TS}$ can be divided into a flat plate drag coefficient $C_{fS}$ and a residual drag coefficient $C_{RS}$ as follows:

When, $Re_S = V_S L_S/\upsilon$, denotes the Reynolds number based on ship length, the friction drag coefficient $C_{fS}$ is calculated from the known (International Towing Tank Conference) ITTC 1957 model-ship correlation line, which is known:

$$C_{fS} = \frac{0.075}{(\log Re_S - 2)^2} \tag{3a}$$

According to known calculations, the friction drag is estimated by the Schoenherr friction line, which requires an iteration process. In aeronautic calculations it is common to use the Schlichting friction line, which does not require an iteration process. The Schlichting friction line and the Schoenherr friction line are almost identical. Using the Schlichting friction line the flat plate friction drag coefficient can be estimated by:

$$C_{fS} = \frac{0.455}{(\log Re_S)^{2.58}} \tag{3b}$$

The residual drag $C_{RS}$ is estimated from model tests.

Existing model test procedures follow Froude's hypothesis that model resistance coefficient $C_{TM}$ can be divided into a flat plate drag coefficient $C_{fM}$ and a residual drag coefficient $C_{RM}$. Since the flow is assumed to be turbulent from the nose at full-scale, turbulence stimulators are traditionally placed at about 5% x/L from the nose to trip the flow in the model tests. FIG. 1A is a Prior Art illustration of a turbulence stimulator 20 positioned at the nose end of a model 10. It should be understood that the turbulence stimulator 20 could be a trip wire (wire ring) that is wrapped around the hull, a sand strip, or a Hama strip, wrapped around the model 10. The parasitic drag $C_{Dtrip}$, is measured from a series of high speed tests and subtracted from the model-scale resistance as follows:

$$C_{RM} = C_{TM} - C_{fM} - C_{Dtrip} \tag{4}$$

With the turbulence stimulator placed at 5% from the nose, flow from nose to the stimulator is laminar and the application of a friction line will overestimate the friction drag. The use of flat plate friction line without consideration of the ship hull shape effect on friction drag also raises a concern. Traditional prediction procedures further assume the residual drag coefficients to be independent of Reynolds number, even though theories and numerical simulation clearly show that residual drag coefficients are sensitive to Reynolds scale (Shen et al, 2015, Young 1939). Accordingly to the theory that the residual drag coefficients are independent of Reynolds numbers:

$$C_{RM} = C_{RS} \tag{5}$$

The drag on a body can be related to the momentum thickness in the wake downstream from the body. In the current approach, an effort is made to achieve the properly scaled momentum thickness of the boundary layer at the end of the body. By achieving a properly scaled momentum thickness in the model-scale test, a scaling formula can be developed to directly scale the total resistance coefficient to full-scale. The drag of a smooth body of revolution placed in a free stream of velocity V at zero incidence has been investigated by Young (1939). From momentum considerations, the drag of the body, R, is given by:

$$R = 2\pi\rho \int_0^\infty u(V-u)y\,dy \tag{6}$$

In equation (6), u is the velocity in the wake parallel to the centerline and y is the distance normal to the centerline of wake. The momentum area $\psi_0$ of the wake far downstream is defined by $$\psi_0 = 2\pi \int_0^\infty \frac{u}{V}\left(1 - \frac{u}{V}\right)y\,dy \tag{7}$$

From (6) and (7), the drag coefficient $C_T$ is related to momentum area by $$C_T = \frac{R}{1/2\rho V^2 S_A} = \frac{2\psi_0}{S_A} \tag{8}$$

In equation (8), $S_A$ is the body surface area. If $\psi 1$ denotes the momentum area measured at the body tail; it is shown by Young (1939) that:

$$\psi_0 = \psi_1 \left(\frac{U_1}{V}\right)^{3.2} \tag{9}$$

where $U_1$ is the velocity at the edge of the boundary layer at the body tail location. From (8) and (9), Young obtained:

$$C_T = \frac{2\psi_1}{S_A}\left(\frac{U_1}{V}\right)^{3.2} \tag{10}$$

Equation (10) shows that the body drag coefficient $C_T$ is related to the momentum area at the body tail.

FIG. 1B shows a cross section of a body of revolution. The section is similar to a typical symmetric airfoil. Let $\theta_1$ denote the momentum thickness at an airfoil trailing edge. Let c denotes the airfoil chord length. The airfoil profile drag $C_D$ is obtained as follows (Young 1939, Schlichting 1979);

$$C_D = \frac{2\theta_1}{c}\left(\frac{U_1}{V}\right)^{3.2} \tag{11}$$

Again, $U_I$ is the velocity at the edge of the boundary layer at the airfoil trailing edge. Equations (10) and (11) show that the flow in the boundary layer of a body has the same characteristics as the flow in the boundary layer of an airfoil. It is desired to have a more accurate predictive method for determining ship resistance. As outlined above, one known method for predicting ship resistance involves the use of the above-mentioned turbulence stimulators. Returning to FIG. 1A, as shown, a turbulence stimulator 20 is positioned at the nose end of the model 10. As known in the art, the turbulence stimulator 20 may be an object such as a wire ring, a sand strip, or a Hama strip. As stated above, stimulators are traditionally placed at about 5% x/L from the nose to trip the flow in the model tests. It is desired to create a more accurate predictive method that does not involve the traditional estimate of placing a turbulence stimulator at about 5% x/L from the nose of the model. It is desired use a "simulator" as opposed to a turbulence stimulator, wherein the simulator modifies the geometry of the model, and is positioned at an optimized location x/L from the nose of the model, and has an optimized size and shape. It is desired to derive equations to calculate these optimizations, i.e., the location, size, and shape of the simulator.

SUMMARY

In one aspect, the invention is a method of predicting a ship resistance value. According to the invention, the method includes, designing a momentum thickness similarity simulator for a ship model in water, wherein the ship model has an axisymmetric body type, and predicting a ship resistance based on the designed momentum thickness similarity simulator. In this aspect, the design of the momentum thickness similarity simulator includes designing said momentum thickness similarity simulator by first deriving three independent equations. According to the method of predicting the ship resistance, the independent equations are used to produce an optimal simulator location on said ship model, optimal simulator size, and optimal simulator shape.

In this aspect, the three independent equations includes a first equation, $$\int_0^{S_k} 1/2\rho U(s)^2 [c'_{f_t}(s) - c'_{f_\lambda}] 2\pi r(s)\cos\alpha(s) ds =$$

$$C_{Dtrip}(1/2)\rho u_k(s_k)^2 2\pi r(s_k) k\cos\alpha(s_k)$$

wherein $S_k$ is the arc length from the leading edge of the ship model to the location of the simulator, wherein U is the local tangential velocity at the edge of the boundary layer, wherein $\rho$ is density of the water, wherein $c_{f_t}'$ is the modified local shear stress coefficient of a turbulent boundary layer flow for a flat plate, with the logarithmic singularity removed, wherein $C_{f_l}'$ is the modified local shear stress coefficient of a laminar boundary layer flow for a flat plate, with the logarithmic singularity removed, wherein r is the local body radius, and wherein $\alpha$ is the angle between the vector tangent to the body and the body centerline.

In this aspect, the three independent equations includes a second equation, $$Re_k = \frac{u_k(s_k)k}{\nu} = 800$$

wherein $Re_k$ is the Reynolds number based on local velocity and simulator size, wherein $u_k$ is the tangential velocity in the boundary layer at a trip location where the simulator has a height k, wherein k is the height/thickness of the simulator, and wherein $S_k$ is as defined above.

In this aspect, the three independent equations includes a third equation, $$C_{Dtrip} = \frac{D_{trip}}{1/2\rho(u_k)^2(2\pi r)k\cos\alpha}$$

wherein $C_{Dtrip}$ is the drag coefficient for parasitic drag for the simulator, wherein $D_{trip}$ is the parasitic drag for the simulator, and wherein $\rho$, $u_k$, r, k, and $u_k$ are as defined above.

BRIEF DESCRIPTION OF THE DRAWINGS

Other features will be apparent from the description, the drawings, and the claims.

DETAILED DESCRIPTION

Figure 2:
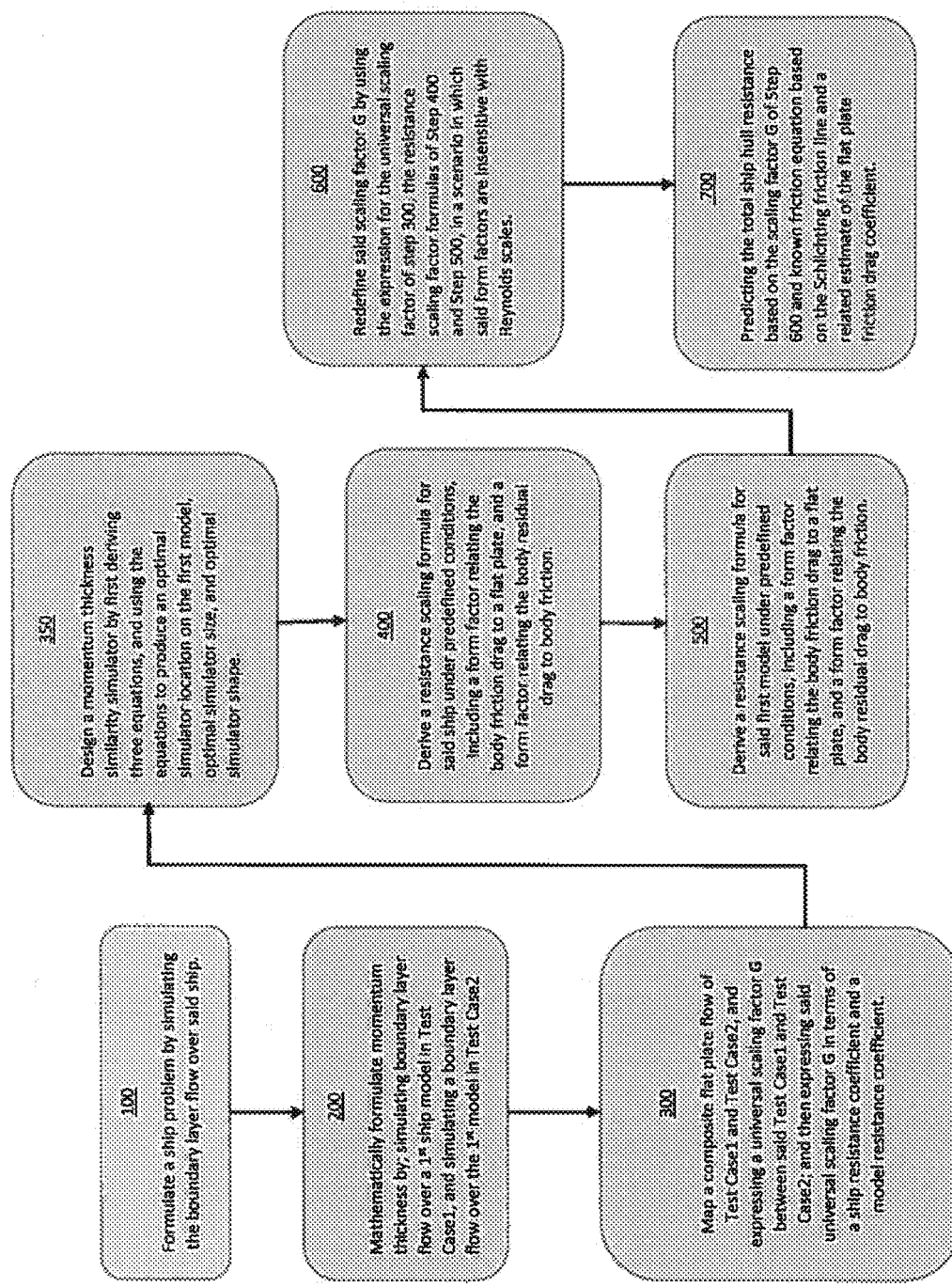
FIG. 2 is an exemplary flowchart illustrating a method of predicting a ship resistance value, according to an embodiment of the invention.

FIG. 2 is an exemplary flowchart illustrating a method of predicting a ship resistance value, according to an embodiment of the of the invention. It should be noted that a key step in this process is the designing of a momentum thickness similarity simulator in Step 350, which in turn makes it possible to make an accurate prediction of the resistance value of a full-sized ship. As illustrated, the method includes several steps, which will be outlined below in greater detail.

Step 100 is the formulating a ship problem by simulating the boundary layer flow over said ship. Step 200 is the mathematical formulating of momentum thickness by, simulating boundary layer flow over a first ship model in a Test Case1 and a Test Case2. Step 300 is the mapping of a composite flat plate flow of the Test Case1 and the Test Case2, and the derivation of an expression for a universal scaling factor G, between the Test Case1 and the Test Case2. Step 350 is the designing of a momentum thickness similarity simulator by first deriving three equations, wherein the equations are used to produce an optimal simulator location on the first model, optimal simulator size, and optimal simulator shape. As outlined below, the momentum thickness simulator modifies the geometry of a model, and it may be an external device such as a wire ring (trip wire), sand paper, or a Hama strip, or the simulator may be integrally formed on the body of the model.

FIG. 2 also shows step 400, the derivation of a resistance scaling formula for the ship under predefined conditions, including a form factor relating the body friction drag to a flat plate, and a form factor relating the body residual drag to body friction. Step 500 is the derivation of a resistance scaling formula for the first model under predefined conditions, including a form factor relating the body friction drag to a flat plate, and a form factor relating the body residual drag to body friction. FIG. 2 also shows step 600, the redefining of the scaling factor G by using the expression for the universal scaling factor of step 300 the resistance scaling factor formulas of Step 400 and Step 500, in a scenario in which said form factors are insensitive with Reynolds scales. Finally, in step 700, total ship hull resistance based on the scaling factor G of Step 600 and known friction equation based on the Schlichting friction line and a related estimate of the flat plate friction drag coefficient, is predicted. By utilizing the momentum thickness similarity simulator of step 350, the ship resistance coefficient $C_{TS}$ is predicted from measurement $C_{TM}$, and based on the scaling factor G of step 600, which leads to the prediction of the ship resistance $R_s$.

Figure 1A:
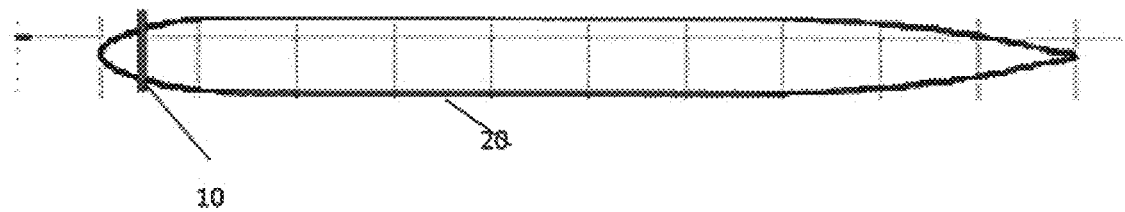
FIG. 1A is a Prior Art illustration of a turbulence stimulator positioned at the nose end of a model.

Returning to step 100, the formulation of a ship problem, it is understood that ship resistance is extremely important because of the hydrodynamic implications. According to step 100, a ship of length $L_s$=550 feet (169.2 m) and cruising at a speed of $V_s$=20 knots is considered for this formulation. The ship is a body of revolution with a standard known ONR Body. The length to diameter ratio IJD=10.96. The ship Reynolds number based on ship length at this speed (20 knots) is $Re_s$=1.5×10$^9$. At such a high Reynolds number, the boundary layer is assumed to be fully turbulent, and initiated from the body nose, i.e., the tip of the bow of the ship. According to the formulation of the ship problem, the pressure distribution $C_p(x)$ along the body surface computed from a known code is shown in FIG. 10 (FIG. 1 of paper) with the nose designated by "LE" and the tail by "TE". FIG. 10 shows the local velocity distribution u(x, y), and sketches boundary layer thickness δ(x), and momentum thickness θ(x).

According to step 100, the flow over a body section as shown in FIG. 10 (FIG. 1 paper) is mapped onto an equivalent flat plate by a mapping function s(x) as sketched in FIG. 2, using equation (12):

$$s(x) = \int_0^x \frac{1}{\cos(\alpha(x))} dx \quad (12)$$

where s is the arc length along the body surface, which is related to distance x in equation (12). The angle α is the angle between the vector tangent to the body surface and the body centerline as shown in FIG. 2.

According to step 100, the formulation of the ship problem includes the consideration of the relationship between the local flow velocity at the edge of the boundary layer U(s) and the ship speed $V_s$, which is obtained from Bernoulli's Equation (13):

$$U_S(s) = V_S \sqrt{1 - C_P} \quad (13)$$

Additionally, the local turbulent boundary layer shear stress on a flat plate $c_{ft}(x)$ is measured by Schlichting (1979) and is given by:

$$c_{ft}(x) = (2 \log_{10} Re_x - 0.65)^{-2.3} \quad (14)$$

In equation (14), x denotes the local distance from the leading edge and $Re_S$ denotes the Reynolds number based on local distance x. $C_{ft}'(x)$ is an expression of $c_{ft}(x)$ that is modified for points very close to the nose to remove the logarithmic singularity at x=0, where the expression for removing the singularity is known and described in Shen et al. (2015).

Figure 3:
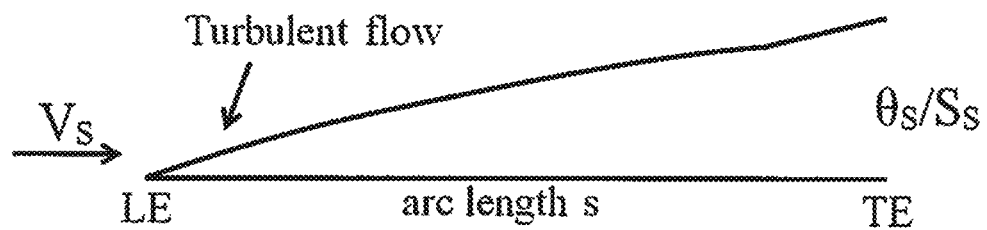
FIG. 3 is an exemplary illustration of the momentum thickness distribution on a ship at 20 knots and a Reynolds number of $1.5 \times 10^9$.

According to step 100, the formulation of the ship problem includes the determination of the normalized momentum thickness distribution $θ_S(s)$ on the equivalent flat plate induced by the local shear stress of Equation (14). FIG. 3 shows the sketched momentum thickness distribution on the ship at 20 knots ($Re_S$=1.5×10$^9$). As shown, the boundary layer is turbulent from the nose (LE) to the tail (TE). According to the problem formulation of step 100, and by letting the arc length from body nose to the tail be denoted by S, the normalized momentum thickness can be determined. The normalized momentum thickness at the body TE is denoted by $θ_{TES}/S_S$. From Equation (11) the ship resistance coefficient $C_{TS}$ can be expressed by:

$$C_{TS} = 2 \frac{\theta_{TES}}{S} \left( \frac{U_{1S}}{V_S} \right)^{3.2} \quad (15)$$

Returning to FIG. 2, step 200 involves mathematically formulating momentum thickness by, simulating boundary layer flow over a first ship model in a Test Case1, and simulating a boundary layer flow over the first model in a Test Case2. Step 200 may include a general problem formulation for a model prior to performing the TestCase1 and TestCase2 momentum thickness formulations.

Figure 4:
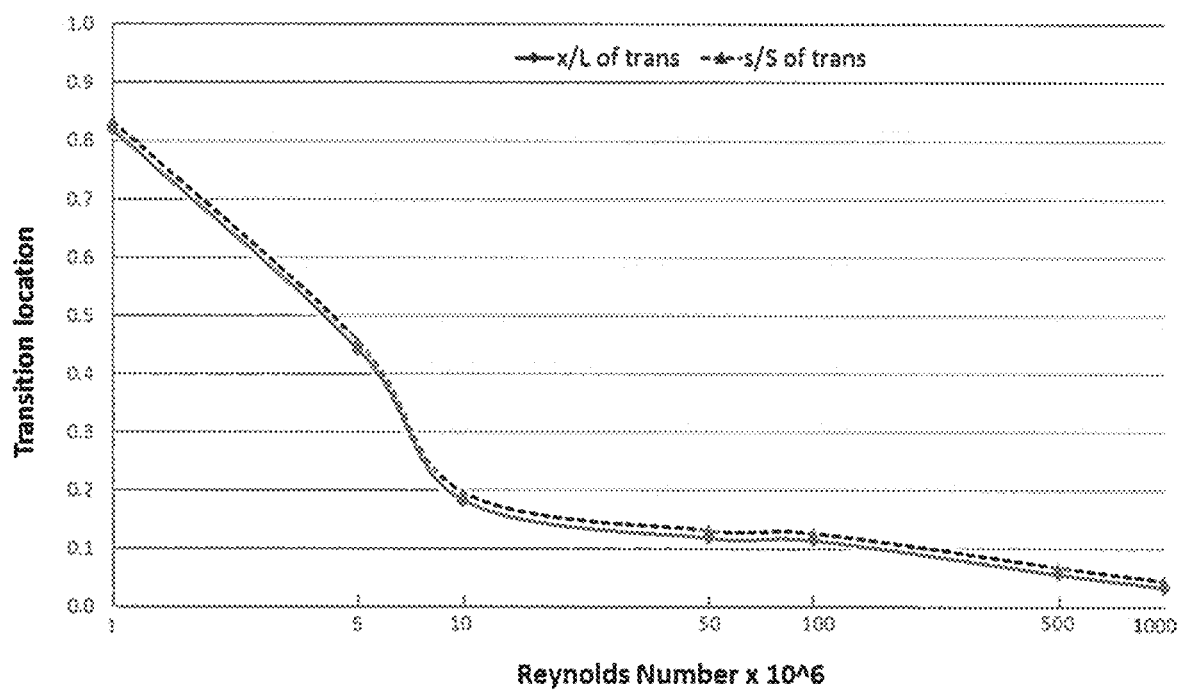
FIG. 4 is a Prior Art illustration of boundary layer transition on a model.

Before formulating test cases, the general method to predict ship resistance $C_{TS}$ from model tests based on momentum thickness concept may be optionally formulated as follows. Taking a hypothetical smooth model with length $L_M$ of 23 feet (7 m) which corresponds to a length scale ratio of $\lambda=23.9$. The boundary layer transition locations for this model may be calculated using known methods, including known software. FIG. 4. illustrates the calculated boundary layer transition at varying Reynolds numbers. Transition locations may be calculated by known methods, by for example, using the known Granville (1974) instability criterion.

According to this hypothetical, the model is tested at a speed $V_M$ of 6 knots, and may be mounted on a carriage in a controlled environment such as a tow tank to avoid contamination from free surface wave drag. Being towed at 6 knots would give a model scale Reynolds number of $Re_M=23\times10^7$. At this Reynolds number the flow remains laminar from the nose to around $x_T/L_M=0.12$. In other words, the boundary layer in the first 12% of the body length is laminar, after which it transitions to turbulent.

The local shear stress in a laminar boundary layer is given by:

$$c_{fn} = \frac{0.664}{\sqrt{Re_k}} \tag{16}$$

The normalized momentum thickness distribution $\theta_M(s)$ on the equivalent flat plate induced by the local shear stress of Equation (16) for laminar and Equation (14) for turbulent is sketched in FIG. 3, which is an exemplary illustration of boundary layer transition on a model, according to an embodiment of the invention. Due to the presence of the laminar boundary layer, the normalized momentum thickness is smaller on the model than on the ship, $$\theta_{TEM}/S_M < \theta_{TES}/S_S. \tag{17}$$

Figure 5:
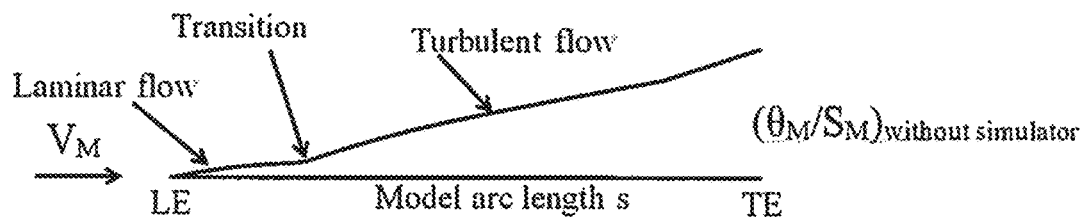
FIG. 5 is an exemplary illustration of momentum thickness distribution on a model, according to an embodiment of the invention.

Furthermore, FIG. 5 is an exemplary illustration of momentum thickness distribution on a model, according to an embodiment of the invention. FIG. 3 and FIG. 5 exhibit different characteristics in boundary layer momentum thickness distributions between the ship and the model. According to this invention, a new test method and a scaling formula is deduced to relate smooth model resistance and ship resistance as shown in FIGS. 3 and 5.

Returning to step 200, as stated above, this involves mathematically formulating of momentum thickness by, simulating boundary layer flow over a first ship model in a Test Case1 and a Test Case2. The mathematical formulation of Test Case1 is as follows. Assume that a first model having a $L_M$ of 7 m is tested in a hypothetical fluid with kinematic viscosity 110 times less than that of water. Assuming the model is tested at 6 knots in this hypothetical fluid, the corresponding Reynolds number would be $(Re_M)_{case1}=1.5\times10^9$ the same as the ship. The normalized momentum thickness distribution of this Test Case on an equivalent flat plate is sketched in FIG. 6. The model tested in this hypothetical fluid will have the same drag coefficient and same normalized momentum thickness. Therefore:

$$(\theta_{TEM}/S_M)_{case1}=(\theta_{TES}/S_S) \tag{18a}$$

and, $$(C_{TM})_{case1}=C_{TS} \tag{18b}$$

Figure 7:
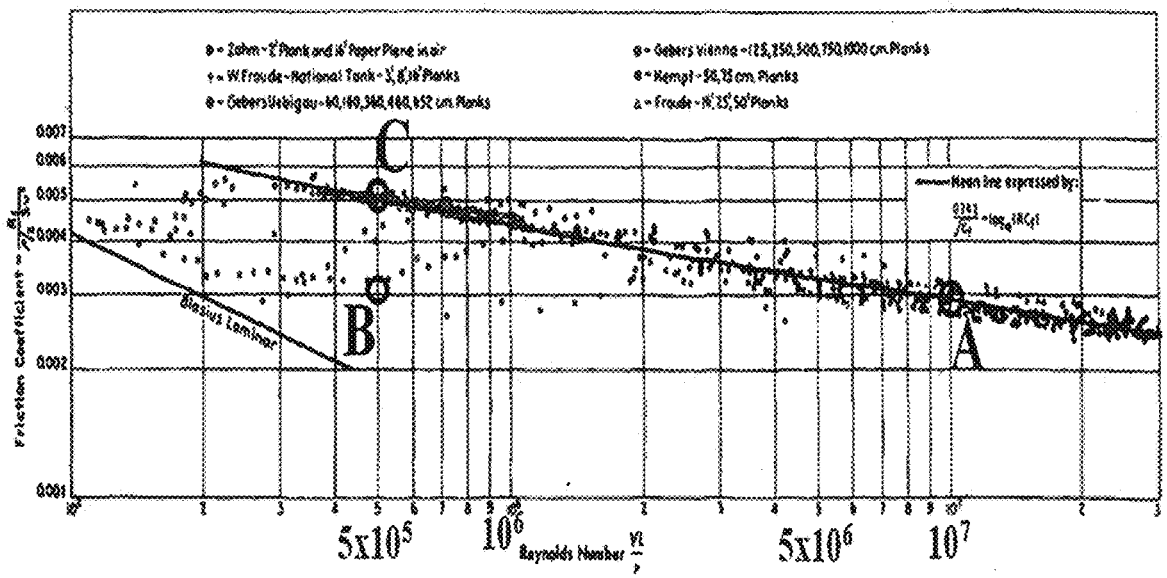
FIG. 7 is a Prior Art illustration showing measured friction coefficients versus Reynolds numbers on smooth flat plates for selected test case Reynolds numbers.

FIG. 7 shows measured friction coefficients versus Reynolds numbers on smooth flat plates (Van Manen and van Oossanen, 1988) for selected test case Reynolds numbers. According to the hypothetical of step 200, the test data at $Re=10^7$ is marked by Point A on FIG. 7. Accordingly, boundary layers on the plates are fully turbulent and the friction coefficient may be estimated from the Schlichting friction line for a given Reynolds number.

Next, according to Test Case1, the test data at $Re=5\times10^5$ are marked at points B and C on FIG. 7. Both data points are for the same Reynolds number. It is known that the location of the boundary layer transition is affected by the intensity of upstream disturbance. Even at the same Reynolds number, boundary layer transition can occur at Point B and C depending on upstream flow disturbance.

Further, according to Test Case1, when there is an increase in the intensity of the turbulence upstream of the plate, the flow instability is initiated at the leading edge (LE). Consequently, for $Re=5\times10^5$ the plate becomes fully turbulent as marked by Point C with the transition located at the LE, as in the test case of Point A for $Re=10^7$. Given this hypothetical, the universal scaling formula (Schlichting/Schoenherr line) may be used to relate the friction coefficients at Point C and Point A.

Figure 8:
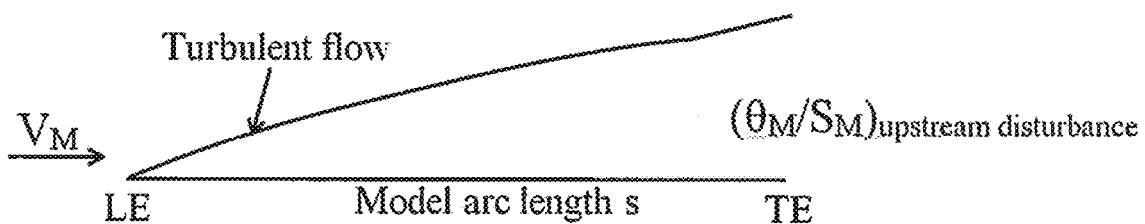
FIG. 8 is an exemplary illustration of the momentum thickness distribution of Test Case2, according to an embodiment of the invention.

According to the hypothetical of step 200, and according to Test Case2, the same model ($L_M=7$ m) is assumed to be tested in a large water tunnel at 6 knots. The corresponding Reynolds number in this test case is again $(Re_M)_{case2}=2.3\times10^7$. Assuming that there is a mechanical device upstream of the body such as wire screens or wire meshes to generate free stream disturbance in the right magnitude that the flow becomes unstable and boundary layer transition occurs right at the leading edge (LE). It is also assumed that the flow instability at the leading edge (LE) is amplified by Tollmien-Schlichting waves. FIG. 8 is an exemplary illustration of the momentum thickness distribution of Test Case2, according to an embodiment of the invention.

Figure 6:
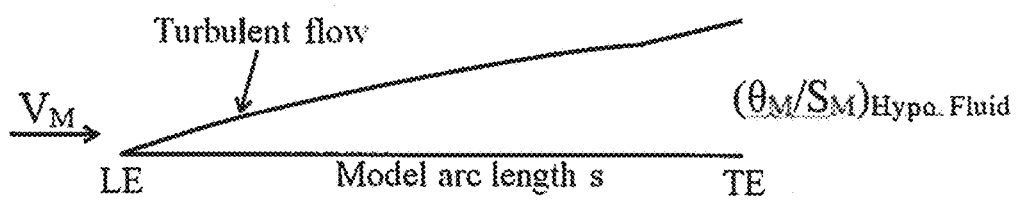
FIG. 6 is an exemplary illustration of the momentum thickness distribution on a first model in a hypothetical fluid, according to an embodiment of the invention.
Figure 9:
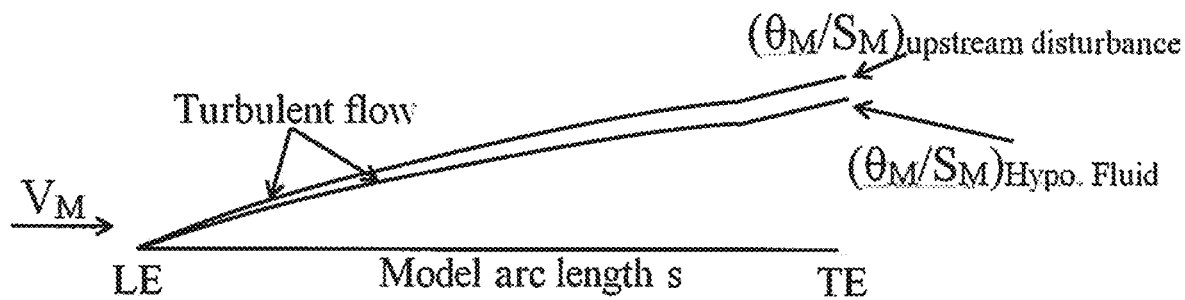
FIG. 9 is an exemplary illustration of a composite plot of FIGS. 6 and 8, according to an embodiment of the invention.

Returning to FIG. 2, step 300 involves mapping a composite flat plate flow of Test Case1 and Test Case2, and expressing a universal scaling factor G between Test Case1 and Test Case2. Step 300 also includes the expressing of the universal scaling factor G in terms of a ship resistance coefficient and a model resistance coefficient. FIG. 9 is an exemplary illustration of a composite plot of FIGS. 6 and 8, according to an embodiment of the invention. As outlined above, FIG. 6 is an exemplary illustration of the Test Case1 momentum thickness distribution, and FIG. 8 illustrates an exemplary illustration of the momentum thickness distribution of Test Case2.

According to the method, Test Case1 and Test Case2 have different Reynolds numbers but have the same boundary layer characteristics. In both test cases, boundary layer transition occurs right at the body nose, i.e., the leading edge (LE) and flow instability is induced by Tollmien-Schlichting waves (Schlichting 1979). Consequently, the boundary layers are fully turbulent for both test cases. Thus a universal scaling formula G relating resistance coefficients for these two cases exists and the drag coefficients between these two test cases are related by:

$$(C_{TM})_{CASE1}=G(C_{TM})_{CASE2} \tag{19}$$

According to the method, the scaling formula G will be derived later. However, a combination of Equations (18b) and (19) gives:

$$C_{TS}=(C_{TM})_{CASE1}=G(C_{TM})_{CASE2} \tag{20}$$

Equation (20) shows that ship resistance $C_{TS}$ can be predicted from Test Case2 with the measurement of model resistance coefficient $(C_{TM})_{CASE2}$ and application of scaling formula G. It should be noted that in the formulation of Test Case2, it is assumed that there is an upstream mechanical device available to generate a free stream disturbance to produce a fully developed turbulent boundary layer on the ship hull from the body nose (LE).

In practice, there is no upstream mechanical device available in towing tank resistance tests. Nevertheless, Test Case2 shows that if we can develop a new test method in such a way that the momentum thickness distribution sketched in FIG. 8 for Test Case2 is simulated in a towing tank test without an upstream mechanical device then the ship resistance can be predicted accurately from towing tank tests. Thus, the momentum thickness at the trailing end (TE) sketched in FIG. 8 for the Test Case2 is the target to be simulated for the model tested in a towing tank. As outlined below, a concept termed momentum thickness similarity has been developed, which utilizes a device termed a momentum thickness similarity simulator in model tests to generate the same momentum thickness at the TE as the one shown in Test Case2.

Step 350 is the designing of a momentum thickness similarity simulator by first deriving three equations, wherein the equations are used to produce an optimal simulator location on the first model, optimal simulator size, and optimal simulator shape. A momentum thickness similarity simulator (as opposed to a turbulence stimulator) is designed to modify the geometry of the model, and is positioned at an optimized location x/L from the nose (LE) of the model, and has an optimized size and shape. It should be understood that modifying the geometry of the model may involve applying an object such as a trip wire (wire ring), sand strip, Hama strip, or the like, and optimizing its application. By optimizing the application it is understood that the object is optimized according to three variables; the shape of the object, the size of the object, and location at which the object is positioned from the LE of the model. If the object is a wire ring for example, optimizing the size may involve changing the diameter of the ring. Optimizing the shape may involve changing the shape so that the ring corresponds to the shape of the model at a particular location.

Alternatively, the geometry of the model may be altered by altering the model itself, i.e., altering the model to include an integrally formed protrusion, or the like. Again, any such optimized change to the structure of the model is done according to the same three variables, i.e., the shape of the protrusion, the size of the protrusion, and the location x/L at which the protrusion is positioned from the LE of the model. As outlined below, the calculations and optimal design of a simulator as described in step 350, creates an accurate predictive method that does not involve the traditional estimates and approximations as in the known practice of placing a turbulence stimulator at about 5% x/L from the nose of the model.

Step 350 starts with considering the same model (of step 300) ($L_M$=7 m) tested in a towing tank at 6 knots. Again, this test gives Reynolds number $Re_M$ of 2.3×10$^7$. The momentum thickness distribution in this test condition with a smooth body on an equivalent flat plate has been sketched in FIG. 5. A difference in momentum thickness distributions between FIGS. 5 and 8 is noticed. A method to simulate the target momentum thickness at the body TE of FIG. 8 with a simulator has been developed. The above-mentioned objects, i.e., a trip wire (wire ring), sand strip, Hama strip, and the like may be used as a simulator, which according to this invention is defined as a foreign object to be placed on the model surface to produce a desired momentum thickness at the TE identical to the target shown in FIG. 8. The model surface may also be altered or designed with a protrusion or the like that also acts as a simulator: Therefore, according to the invention, the simulator is defined by the three design variables outlined above: the shape of the object, the size of the object, and distance $x_k$ from the body nose, i.e., the LE of the model.

Figure 10A:
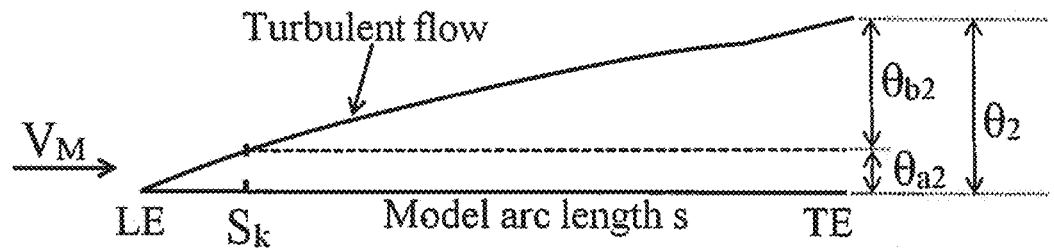
FIG. 10A is an exemplary illustration of the momentum thickness distribution on model to be simulated in a towing tank test at 6 knots at $Re_M = 2.3 \times 10^7$.
Figure 10B:
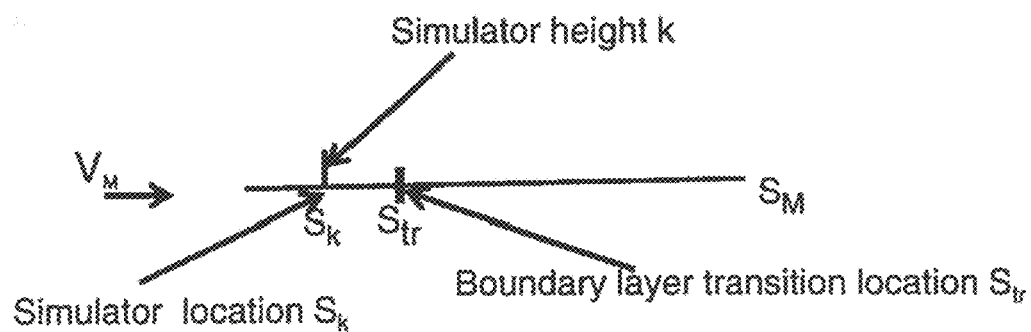
FIG. 10B is an exemplary illustration of a momentum thickness simulator location $S_k$ and height k, according to an embodiment of the invention.
Figure 10C:
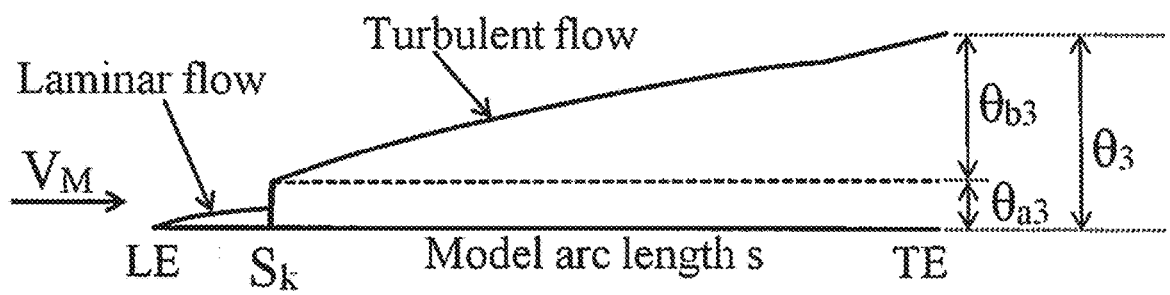
FIG. 10C is an exemplary illustration of a simulated momentum thickness with the simulator for Test Case3 at $Re_M = 2.3 \times 10^7$.

The target momentum thickness to be simulated in a towing tank tests is presented in FIG. 10A on the equivalent flat plate plot. A simulator of Hama strip (Hama 1957) with height k is placed at the location $x_k$ on the model surface as sketched in FIG. 10B. The momentum thickness produced by a Test Case3 to simulate the target is sketched in FIG. 10C. The arc length $s_k$ is related to $x_k$ by equation (12). For simplified writing, the subscript "case' associated with θ expression is omitted in FIGS. 10A, 10B, and 10C. The momentum thickness at body TE for the Test Case2 is denoted by $\theta_2$ and decomposed into $\theta_{a2}$ at the simulator location $s_k$ and $\theta_{b2}$ from the simulator location to the trailing edge of the model. The target momentum thickness, $\theta_2$, is simulated in Test Case3 of towing tank test if the expressions $(\theta_{a3})=(\theta_{a2})$ and $(\theta_{b3})=(\theta_{b2})$ are satisfied. Namely, if:

$$(\theta_{a3})=(\theta_{a2}) \tag{21a}$$

and $$(\theta_{b3})=(\theta_{b2}) \tag{21b}$$

in the towing tank tests, then:

$$\theta_3=(\theta_{a3})+(\theta_{b3})=(\theta_{a2})+(\theta_{b2})=\theta_2 \tag{22}$$

Equation (22) shows that momentum thickness similarity at the TE between Test Case3 and Test Case2 is achieved if equations (21a and 21b) can be satisfied. A test method has been developed that satisfies equation (22) by the application of a momentum thickness similarity simulator.

As stated above Step 350 involves the derivation of three equations to modify the geometry of the model. The modification of the model may involve designing a simulator, which may be an optimal design of an object such as a wire ring, sand strip, Hama strip, or the like, or the optimal design of a modification that is integral to the model structure, such as protrusions, dimples, whiskers, or the like. The design of the simulator is explored for the scenario to achieve $(\theta_{a3})=(\theta_{a2})$ at the simulator location.

Returning to FIG. 10A for Test Case2 with upstream disturbance, boundary layer transition occurs right at LE. The flow over the whole body surface is turbulent. The local turbulent shear stress is given in equation (14). On the other hand, in Test Case3, the flow is laminar from the LE to the simulator location $S_k$ and the local shear stress in this laminar flow region is given in equation (16). To achieve $(\theta_{a3})=(\theta_{a2})$, the difference in shear stresses between laminar and turbulent flows on drag and momentum thickness must be compensated by introducing parasitic drag from the simulator. This requirement can be expressed mathematically as follows:

$$\int_0^{S_k} 1/2\rho U(s)^2 [c'_{f_t}(s) - c'_{f\lambda}] 2\pi r(s)\cos\alpha(s)ds = \tag{23}$$

$$C_{Dtrip}(1/2)\rho u_k(s_k)^2 2\pi r(s_k)k\cos\alpha(s_k)$$

The variable U(s) is given in equation (13), r(s) is the body radius and α(s) is the contact angle shown in FIG. 2.

The left hand side of equation (23) shows the difference in friction drag between Test Case2 and Test Case3 from body LE to the simulator location. The right hand side of equation (23) represents the parasitic drag induced by the simulator to match the needed friction drag differential between these two types of boundary layers. Equation (23) has three unknowns: the simulator size/height k, the location $s_k$ and the shape of simulator expressed by parasitic drag coefficient $C_{Dtrip}$.

The design of the simulator is further explored for the scenario to achieve $(\theta_{b3})=(\theta_{b2})$ from simulator to the trailing edge. As shown in FIG. 10a, the boundary layer is turbulent from simulator location to the TE in Test Case2. To achieve $(\theta_{b3})=(\theta_{b2})$, the turbulent boundary layer from the simulator location to TE in Test Case2 must be simulated in test Case3. Available experimental data show that boundary layer transition will occur right at the simulator location if the Reynolds number based on simulator size/height k and boundary layer velocity $u_k$ at the height of the simulator is set to 800. It should be understood that the "800" $Re_k$ value is set based on the specific known conditions. It is within the scope of this invention to set this value to higher than 800 or lower than 800, depending on what is known of the specific environmental conditions. (Braslow et al, 1966, McCarthy et al, 1976, Tani, 1969). Depending on the type of simulator, the height k, the trip height, may be the thickness of a Hema strip or the radius of a wire ring (trip wire), for example.

$$Re_k = \frac{u_k(s_k)k}{V} = 800 \qquad (24)$$

The design of the simulator is further explored by examining parasitic drag associated with shape of simulator $C_{Dtrip}$. With the installation of a simulator, parasitic drag is induced by the simulator in addition to the hull drag. Let $D_{trip}$ denote the parasitic drag due to the simulator. The parasitic drag coefficient $C_{Dtrip}$ at simulator location $s_k$ is defined as follows:

$$C_{Dtrip} = \frac{D_{trip}}{1/2\rho(u_k)^2(2\pi r)k\cos\alpha} \qquad (25)$$

Figure 11:
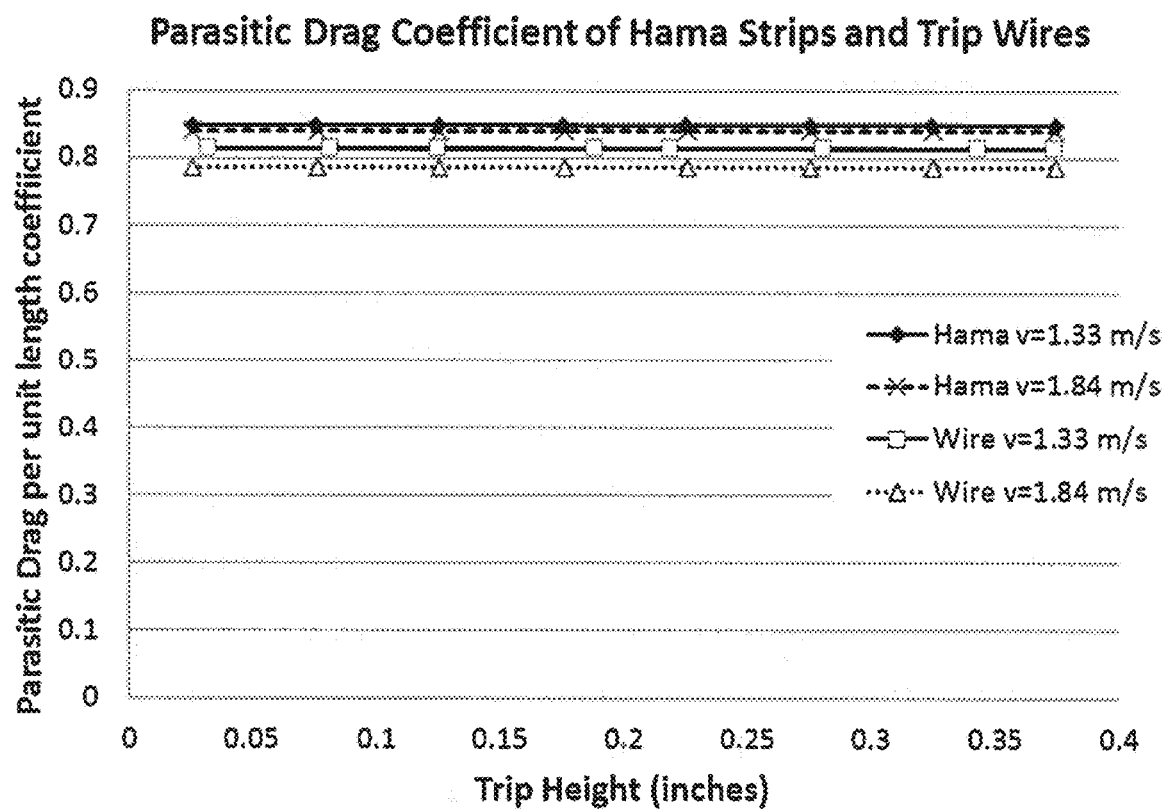
FIG. 11 is a Prior Art illustration of parasitic drag coefficients of Hama strips and trip wires.

The parasitic drag, $D_{trip}$, associated with Hama strips and trip wires (wire rings) have been measured on a flat plate in a water tunnel and shown in FIG. 11 for two test speeds and several roughness heights (Peguero, 2016). Parasitic drag coefficients are observed to be insensitive with simulator heights and speeds for Hama strips and show slight variation with speed for the case of trip wires.

Figure 12:
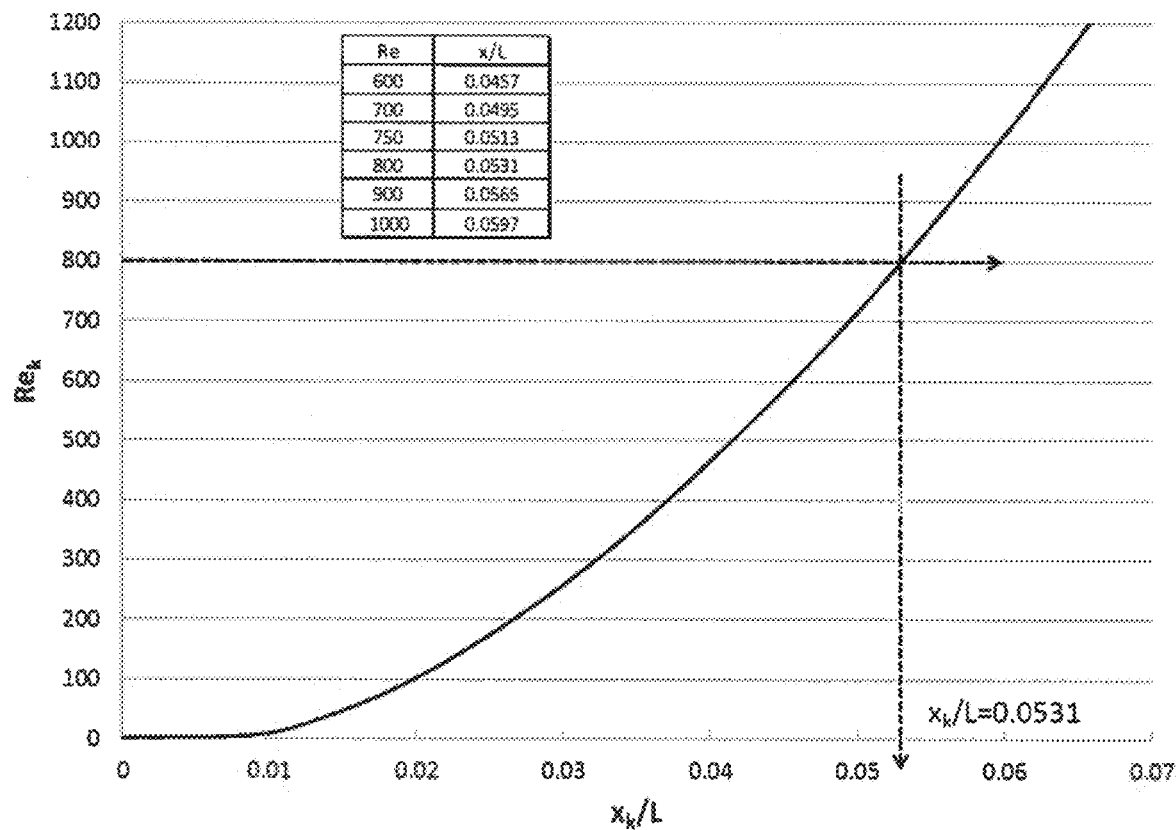
FIG. 12 is an illustration of Reynolds number based on Hama strip thickness to produce delta drag based on velocity at edge of Hama strip on ONR Body 1 with length of 7 meters at test speed of 6 knots.
Figure 13:
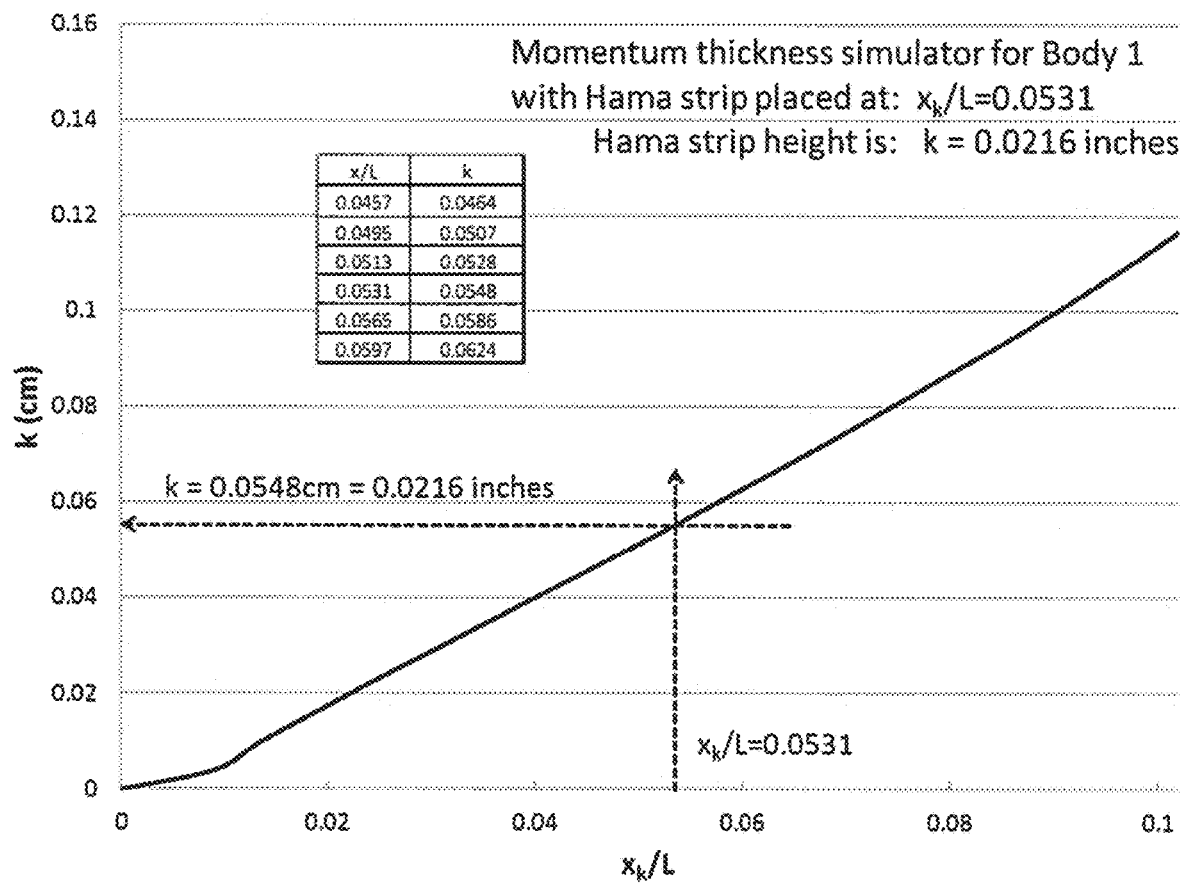
FIG. 13 is an exemplary illustration of Hama strip thickness to match delta drag on ONR Body 1, L=7 meters, at test speed of 6 knots.

As stated above, there are three variables to design a simulator to achieve the momentum thickness similarity requirement in towing tank resistance tests. They are k, $s_k$ and $C_{Dtrip}$. According to step 350, equations (23), (24), and (25) as derived, may be used to determine the three design variables uniquely with three equations for a given model geometry and test speed. It should also be understood that the optimization of the simulator design as stated above and throughout step 350, also involves on the use of collected experimental data. The collected experimental data may include; parasitic drag coefficients of Hama strips and trip wires, as outlined and illustrated in FIG. 11, Reynolds number based on Hama strip thickness to produce delta drag based on velocity at the edge of a Hama strip on ONR Body 1, with a length of 7 meters at test speed of 6 knots as outlined and illustrated in FIG. 12, and Hama strip thickness to match delta drag on ONR Body 1, L=7 meters, at test speed of 6 knots as outlined and as illustrated in FIG. 13. An exemplary calculation using a numerical example is now outlined, utilizing a standard axisymmetric body-type, the ONR Body1.

Figure 1B:
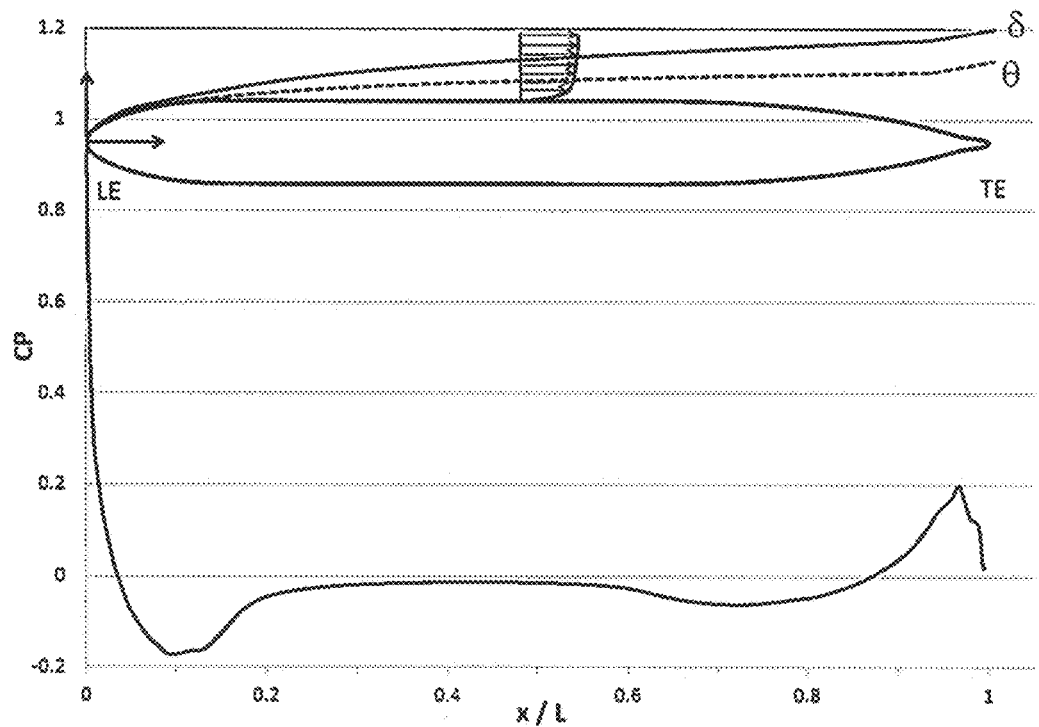
FIG. 1B is a Prior Art cross-sectional illustration of a body of revolution.
Figure 1C:
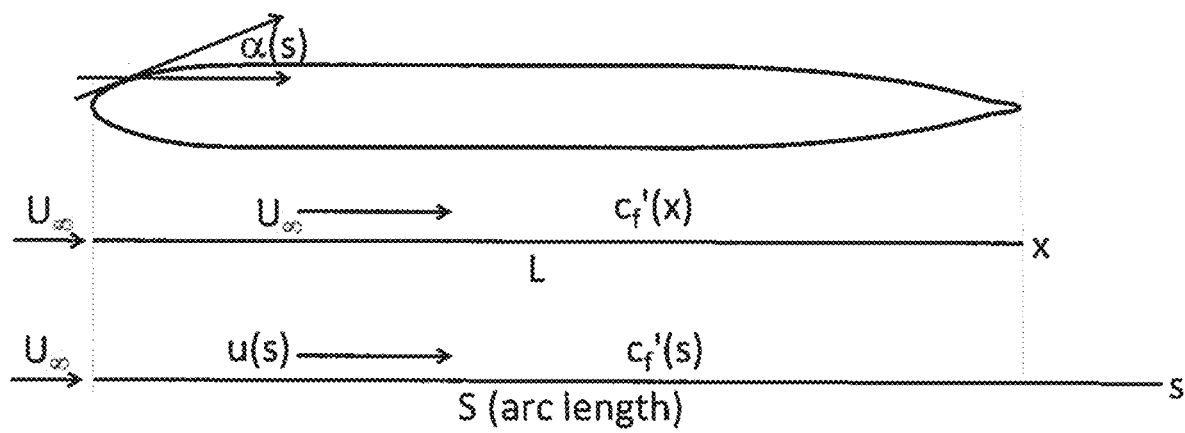
FIG. 1C a Prior Art illustration of an equivalent flat plate mapping of flow on ONR Body1.

ONR Body1 is an axisymmetric body of revolution with length to diameter ratio of 10.96. The offsets of this body are given in a paper by Huang et al. (1978). The body profile and the pressure distribution are shown in FIG. 1B. The flow over the equivalent flat plate is sketched in FIG. 1C. The local velocity at the edge of the boundary layer thickness U(s) is given by Equation (13).

In Equation (23), there are three variables. $s_k$, k, and $C_{Dtrip}$. A llama strip with $C_{Dtrip}=0.844$ for Equation (25) is selected as an example for this numerical study, based on the data shown in FIG. 11. Equation (23) is then reduced to two variables of k and sk. For example, given a simulator location expressed in $x_k$, the simulator height k can be calculated from Equation (23) and plotted in FIG. 12. From this relationship between k and $x_k$, we can calculate $Re_k$ versus $x_k/L$ as plotted in FIG. 13.

Equation (24) obtained from boundary layer transition data states that turbulent flow occurs right at the simulator location if the value of $Re_k$ is set to 800. From FIG. 13 $x_k/L=0.0531$ is obtained at $Re_k=800$. From FIG. 12, a value of k=0.0548 cm (0.0216 inch) is obtained at $x_k/L=0.0531$. Numerical results show that a simulator consisting of a Hama strip of height k=0.0548 cm, placed at xii/L=0.0531 on the model surface will achieve momentum thickness similarity at the TE between model and ship for the model speed of 6 knots.

The above numerical example shows that in model resistance tests, a simulator size and location are uniquely specified for a given model and test speed. As stated above, the simulator modifies the geometry of the model. As will be outlined below, the above results is used to measure a model resistance and predict ship resistance. In the above numerical example, a Hama strip is used as the simulator to modify the geometry of the model. By using the appropriate $C_{Dtrip}$ values, Equations (23), (24), and (25) may also be used to provide simulator sizes for wire rings and sand strips when these items are employed as simulators. Equations (23), (24), and (25) may also be used to determine simulator sizes for modifications that are integral to the model itself. Integrated modifications may include protrusions, dimples, whiskers, and the like.

Returning once again to FIG. 2, at step 400, a resistance scaling formula for the ship (as defined above) under predefined conditions is derived. According to the method, for the ship, the resistance scaling formula includes a form factor relating the body friction drag to a flat plate, and a form factor relating the body residual drag to body friction. According to the derivation of step 400, $C_{TS}$, $C_{FS}$ and $C_{RS}$ denote the coefficients for total drag, body friction drag, and body residual drag, respectively, for the ship. The total drag is expressed above in Equation (2). According to step 400, $C_{fS}$ denotes flat plate friction drag, $n_1$ denotes a form factor relating the body friction drag to a flat plate friction drag, and $n_2$ denotes a form factor relating body residual drag to body friction drag. Then, $$C_{FS}=(1+n_{1S})C_{fS} \qquad (26\text{ a), and}$$

$$C_{RS}=n_{2S}C_{FS} \qquad (26\text{ b)}$$

And, the ship total drag can be expressed by:

$$C_{TS}=C_{FS}+C_{RS}=(1+n_{1S}+n_{2S}+n_{1S}n_{2S})C_{fS}\equiv(1+K_S)C_{fS} \quad (27)$$

where $$K_S\equiv 1+n_{1S}+n_{2S}+n_{1S}n_{2S} \quad (28)$$

Returning once again to FIG. 2, at step 500 a resistance scaling formula for the model (as defined above) under predefined conditions is derived. According to the method, for the first model, the resistance scaling formula includes a form factor relating the body friction drag to a flat plate, and a form factor relating the body residual drag to body friction. According to the derivation of step 500, $C_{TM}$, $C_{FM}$ and $C_{RM}$ denote the coefficients for total drag, body friction drag, and body residual drag, respectively, for the ship. The total drag is expressed above in Equation (2). According to step 500, $C_{fS}$ denotes flat plate friction drag, $n_1$ denotes a form factor relating the body friction drag to a flat plate friction drag, and $n_2$ denotes a form factor relating body residual drag to body friction drag.

The model resistance can be expressed by:

$$C_{TM}=C_{FM}+C_{RM}=(1+n_{1M}+n_{2M}+n_{1M}n_{2M})C_{fM}\equiv(1+K_M)C_{fM} \quad (29)$$

where, $$K_M\equiv 1+n_{1M}+n_{2M}+n_{1M}n_{2M} \quad (30)$$

FIG. 2 also shows step 600, in which the scaling factor G is redefined by using the expression for the universal scaling factor of step 300, the resistance scaling factor formulas of Step 400 and Step 500, in a scenario in which said form factors are independent of Reynolds scales. According to the method, the Reynolds effect on form factors $n_1$ and $n_2$ is considered. Numerical studies on various axisymmetric bodies by Young (1939) and Schlichting (1979) show that the form factors $n_1$ and $n_2$ are insensitive with Reynolds scales. Thus, $$n_{1S}=n_{1M} \text{ and } n_{2S}=n_{2M} \quad (31a)$$

and $$K_S=K_M \quad (31b)$$

From Equations (27) through (31b), we obtain the scaling formula G as follows:

$$G \equiv \frac{C_{TS}}{C_{TM}} = \frac{(1+K_S)C_{fS}}{(1+K_M)C_{fM}} = \frac{C_{fS}}{C_{fM}} \quad (32)$$

As outlined herein in step 600, the scaling formula G is shown to be the ratio of flat plate friction coefficients at ship Reynolds number and model Reynolds number. As shown in FIG. 2, at step 700 a total ship hull resistance based on the scaling factor G of Step 600 and known friction equation based on the Schlichting friction line and a related estimate of the flat plate friction drag coefficient, is predicted. By utilizing the momentum thickness similarity simulator of step 350, the ship resistance coefficient $C_{TS}$ is predicted from measurement $C_{TM}$, and based on the scaling factor G of step 600, determining the ship resistance $R_S$. By substituting Equation (3b) into Equation (32), the total ship hull resistance is:

$$C_{TS} \equiv GC_{TM} = C_{TM}\frac{C_{fS}}{C_{fM}} = C_{TM}\left[\frac{\text{Log}(\text{Re}_M)}{\text{Log}(\text{Re}_S)}\right]^{2.58} \quad (33)$$

According to the invention, by fitting the model with a momentum thickness similarity simulator, designed in Step 350, the ship resistance coefficient $C_{TS}$ can be predicted from measurement of $C_{TM}$ with the application of scaling formula G as shown in Equation (33). Ship resistance $R_S$ can be accurately predicted by Equation (1).

What has been described and illustrated herein are preferred embodiments of the invention along with some variations. The terms, descriptions and figures used herein are set forth by way of illustration only and are not meant as limitations. Those skilled in the art will recognize that many variations are possible within the spirit and scope of the invention, which is intended to be defined by the following claims and their equivalents, in which all terms are meant in their broadest reasonable sense unless otherwise indicated.

What is claimed is:

1. A hydrodynamic testing method comprising:
   causing a model-scale vessel to move through water, wherein:
   said model-scale vessel is characterized by a model-scale momentum thickness when said model-scale vessel moves through water at a selected model-scale vessel speed;
   said model-scale momentum thickness relates to a model-scale boundary layer of said model-scale vessel;
   said model-scale momentum thickness corresponds to a full-scale momentum thickness;
   said full-scale momentum thickness relates to a full-scale boundary layer of a full-scale vessel, wherein:
   said full-scale vessel is characterized by said full-scale momentum thickness when said full-scale vessel moves through water at a selected full-scale vessel speed;
   said model-scale vessel is characterized by a selected geometry and includes a smooth axisymmetric body and a momentum thickness simulator;
   in furtherance of said selected geometry, said momentum thickness simulator is characterized by a selected shape and a selected height;
   said providing of said model-scale vessel includes coupling said momentum thickness simulator with said smooth axisymmetric body at a location at a selected distance from said model-scale leading edge;
   said model-scale vessel is characterized by a turbulent said model-scale boundary layer between said momentum thickness simulator and said model-scale trailing edge;
   measuring a model-scale resistance of said model-scale vessel, wherein said model-scale resistance is associated with said movement of said model-scale vessel through water at said model-scale vessel speed during which time said model-scale vessel is characterized by said model-scale momentum thickness;
   determining a full-scale resistance of said full-scale vessel, said determining of said full-scale resistance including using a computer, wherein:

said full-scale resistance is associated with said movement of said full-scale vessel through water at said full-scale vessel speed during which time said full-scale vessel is characterized by said full-scale momentum thickness;

said determining of said full-scale resistance includes performing scaling of said model-scale resistance with respect to said full-scale resistance;

said performance of said scaling includes taking into consideration said movement of said model-scale vessel through water at said model-scale vessel speed during which time said model-scale vessel is characterized by said model-scale momentum thickness;

said performance of said scaling further includes taking into consideration said movement of said full-scale vessel through water at said full-scale vessel speed during which time said full-scale vessel is characterized by said full-scale momentum thickness;

said full-scale resistance is determined directly from said model-scale resistance in the absence of consideration of said full-scale resistance as consisting of frictional said full-scale resistance and residual said full-scale resistance.

2. The hydrodynamic testing method of claim 1, wherein:

said full-scale vessel is characterized by a full-scale leading edge and a full-scale trailing edge;

said model-scale vessel is characterized by a model-scale leading edge and a model-scale trailing edge;

said correspondence of said model-scale momentum thickness to said full-scale momentum thickness includes equivalence of said model-scale momentum thickness at said model-scale trailing edge to said full-scale momentum thickness at said full-scale trailing edge.

3. The hydrodynamic testing method of claim 2, wherein said momentum thickness simulator includes at least one structure selected from the group consisting of trip wire and Hama strip.

4. The hydrodynamic testing method of claim 1, wherein said momentum thickness simulator includes at least one structure selected from the group consisting of trip wire and Hama strip.

\* \* \* \* \*